(12) United States Patent
Wu et al.

(10) Patent No.: US 7,591,066 B2
(45) Date of Patent: Sep. 22, 2009

(54) CLAMPING DEVICE FOR FLEXIBLE SUBSTRATE

(75) Inventors: Chin-Jyi Wu, Baoshan Township, Hsinchu County (TW); Chen-Der Tsai, Hsinpu Township, Hsinchu County (TW); Yun-Chuan Tu, Jhudong Township, Hsinchu County (TW); Te-Chi Wong, Yijhu Township, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 266 days.

(21) Appl. No.: 11/391,975

(22) Filed: Mar. 28, 2006

(65) Prior Publication Data

US 2007/0119044 A1    May 31, 2007

(30) Foreign Application Priority Data

Nov. 25, 2005    (TW) .................................. 94141429

(51) Int. Cl.
*B23P 19/00* (2006.01)
*B23Q 1/00* (2006.01)

(52) U.S. Cl. .............................. 29/739; 29/729; 29/740; 29/744; 269/50; 269/310; 269/903

(58) Field of Classification Search ........... 29/740–743, 29/729, 739, 830–832, 281.1; 269/47, 55, 269/77, 903; 414/788.7, 796.6, 792.9
See application file for complete search history.

(56) References Cited

U.S. PATENT DOCUMENTS

| 2,284,972 | A | * | 6/1942 | Carson | 269/13 |
| 4,593,804 | A | * | 6/1986 | Kinsey et al. | 193/41 |
| 5,566,840 | A | * | 10/1996 | Waldner et al. | 211/41.17 |
| 5,785,307 | A | * | 7/1998 | Chung | 269/254 CS |
| 5,897,108 | A | * | 4/1999 | Gordon et al. | 269/50 |
| 6,164,634 | A | * | 12/2000 | Farlow | 269/47 |
| 6,183,190 | B1 | * | 2/2001 | Raiteri | 414/788.7 |
| 6,242,933 | B1 | * | 6/2001 | Yap | 324/755 |
| 6,511,574 | B2 | * | 1/2003 | Barringer et al. | 156/295 |
| 6,904,671 | B1 | * | 6/2005 | Farrens et al. | 29/829 |
| 7,043,831 | B1 | * | 5/2006 | Farnworth et al. | 29/852 |
| 7,107,672 | B2 | * | 9/2006 | Onitsuka et al. | 29/832 |

\* cited by examiner

*Primary Examiner*—Minh Trinh
(74) *Attorney, Agent, or Firm*—J.C. Patents

(57) ABSTRACT

A clamping device for a flexible substrate is provided. The clamping device includes a carrier board. The carrier board has a fixed positioning assembly and a plurality of movable positioning assemblies. The fixed positioning assembly and the movable positioning assemblies are disposed in locations that almost correspond to a plurality of through holes on the flexible substrate. The fixed positioning assembly includes a hole body with a positioning hole and a dowel pin. Each movable positioning assembly includes a hole body with a positioning hole, a plurality of curved extending arms and a dowel pin. Each curved extending arm is connected to the hole body and the carrier board and the dowel pin is inserted into the positioning hole.

8 Claims, 12 Drawing Sheets

CLAMPING DEVICE FOR FLEXIBLE SUBSTRATE

CROSS-REFERENCE TO RELATED APPLICATION

This application claims the priority benefit of Taiwan application Ser. No. 94141429, filed on Nov. 25, 2005. All disclosure of the Taiwan application is incorporated herein by reference.

BACKGROUND OF THE INVENTION

1. Field of the Invention

The present invention relates to a clamping device and manufacturing method thereof. More particularly, the present invention relates to a clamping device for a flexible substrate and method of fabricating the same.

2. Description of the Related Art

Due to the continuous progress on the technology of integrated circuit process and an increasing need for mobile communication, personal mobile communication equipments have continuously integrate a lot of function for entertainment or personal information management (PIM). However, with the gradual increase in functions, the display device originally on the mobile communication device may not be large enough to display all the increased quantity of data. To meet the demand for a more compact mobile communication device, the display device often has to adopt a hideaway form. In other words, the display device is flexible and can be roll-up.

In general, the cost of producing the components of a display device is relatively high. Therefore, if the widely adopted technique of fabricating a thin film transistor (TFT) display device is used to fabricate the flexible display device, the production cost can be lowered significantly. However, the machine for producing the TFT display device is incapable of clamping a flexible substrate. Thus, the conventional method is to apply some glue so that the flexible substrate is attached to the machine through the gluing agent for performing the necessary processing operations. Yet, the gluing method of fixing the flexible substrate has many drawbacks. First, the planarity of the attached flexible substrate is not so good. Furthermore, many production processes such as chemical evaporation deposition, thermal evaporation deposition, plasma etching, photolithographic process or the spin-coat process frequently cause the peeling of the flexible substrate due to heat or chemical attack of the adhesive agent. Once the flexible substrate has peeled off from the place of attachment, subsequently processes cannot proceed.

SUMMARY OF THE INVENTION

Accordingly, the present invention is to provide a clamping device for a flexible substrate that the flexible substrate can be clamped smoothly.

The present invention is to provide a clamping device for a flexible substrate whose fabrication process is compatible with the process for fabricating a thin film transistor (TFT). Furthermore, the clamping device can withstand a high temperature and is chemically stable, tough and heat resistant.

The present invention is to provide a clamping device for a flexible substrate that facilitates production processing.

To achieve these and other advantages and in accordance with the purpose of the invention, as embodied and broadly described herein, the invention provides a clamping device for a flexible substrate. The flexible substrate includes a carrier board. The carrier board has a fixed positioning assembly and a plurality of movable positioning assemblies. The fixed positioning assembly and the movable positioning assemblies are disposed in locations that almost correspond to a plurality of through holes on the flexible substrate.

According to one embodiment of the present invention, each movable positioning assembly includes a hole body with a positioning hole, a plurality of curved extending arms and a dowel pin. Each curved extending arm is connected to the hole body and the carrier board and the dowel pin is inserted into the positioning hole. In addition, the movable positioning assembly may further include at least a shift-limiting portion. The shift-limiting portion is disposed between two adjacent curved extending arms and connected with the carrier board such that a gap exists between the shift-limiting portion and two adjacent extending arms and between the shift-limiting portion and the hole body. Furthermore, the upper edge of the positioning hole of the hole body in the fixed positioning assembly and the upper edge of the positioning hole of the hole body in the movable positioning assembly are fabricated to produce an inverted frustum of a cone.

According to one embodiment of the present invention, each movable positioning assembly can movably flush into the carrier board. The movable positioning assembly includes a hole body with a positioning hole, an outer ring, a plurality of curved extending arms and a dowel pin. The outer ring is disposed outside the hole body and can be movably connected to the carrier board. Each curved extending arm is connected to the hole body and the outer ring. The dowel pin is inserted into the positioning hole of the hole body. In addition, the movable positioning assembly may further include at least a shift-limiting portion. The shift-limiting portion is disposed between two adjacent extending arms and connected to the out ring. A gap is formed between the shift-limiting portion and two adjacent extending arms and between the shift-limiting portion and the hole body. Furthermore, the upper edge of the positioning hole of the hold body in the fixed positioning assembly and the upper edge of the positioning hole of the hole body in the movable positioning assembly are fabricated to produce an inverted frustum of a cone.

According to one embodiment of the present invention, the carrier board and the movable positioning assemblies can be fabricated using a surface-treated metal, metal alloy or stainless steel, or ceramics, glass, polymer or a composite material.

The present invention also provides a method of fabricating a clamping device for a flexible substrate. The method includes forming a first positioning hole and a plurality of second positioning holes in a carrier board. The first positioning hole and the second positioning holes correspond in position to a plurality of through holes on the flexible substrate. Then, a first dowel pin suitable for inserting into the first positioning hole is provided to form a fixed positioning assembly. A plurality of second dowel pins suitable for inserting into the second positioning holes. A portion of the carrier board material close to the second positioning holes is removed to form a hole body of a movable positioning assembly and a plurality of curved extending arms that have connection with the hole body and the carrier board. Hence, a plurality of movable positioning assemblies is formed.

According to one embodiment of the present invention, the aforementioned method of removing a portion of the carrier board close to the second positioning holes includes line cutting, surface cutting, punching and electro-discharge process. In addition, the upper edge of the first positioning hole and the upper edge of the second positioning hole are fabricated to produce an inverted frustum of a cone.

The present invention also provides an alternative method for fabricating a clamping device for a flexible substrate. The method includes forming a plurality of holes in a carrier board. Then, a fixed positioning assembly is flushed into one of the holes while movable positioning assemblies are flushed into the other holes.

According to the embodiment of the present invention, the method of forming the movable positioning assemblies includes providing a substrate having a size identical to the trench in the carrier board and forming a plurality of positioning holes in the substrate. Then, a portion of the substrate close to the positioning holes is removed to form a hole body, an outer ring and a plurality of curved extending arms of the movable positioning assemblies. The outer ring is disposed outside the hole body and is connected to the hole body through the curved extending arm. Furthermore, the outer ring is movably connected to the carrier board. A plurality of dowel pins suitable for inserting into the positioning holes is provided.

According to one embodiment of the present invention, the aforementioned method of removing a portion of the substrate close to the positioning holes includes line cutting, surface cutting, punching and electro-discharge processes. In addition, the upper edge of the first positioning hole and the upper edge of the second positioning hole are fabricated to produce an inverted frustum of a cone.

In the clamping device of the present invention, the fixed positioning assembly can provide a means of positioning and the curved extending arms of the movable positioning assemblies can provide an spring force in different directions. Hence, the relative position between the hole body and the positioning hole can be micro-adjusted so that the positioning hole of the movable positioning assembly and the positioning hole of the flexible substrate can align. Consequently, when the flexible substrate is positioned on the carrier board of this clamping device and the dowel pins are inserted into the positioning holes of the hold bodies, the flexible substrate is smoothly flattened out.

The clamping device in the present invention for clamping a flexible substrate has special properties including the capacity to withstand a high temperature, chemically stable, tough and heat resistant. Moreover, the processing method is compatible to the method of fabricating thin film transistor (TFT) display device so that it can be applied using the existing equipment to produce roll up type flexible display device. In other words, considerable equipment cost can be saved through the method of the present invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
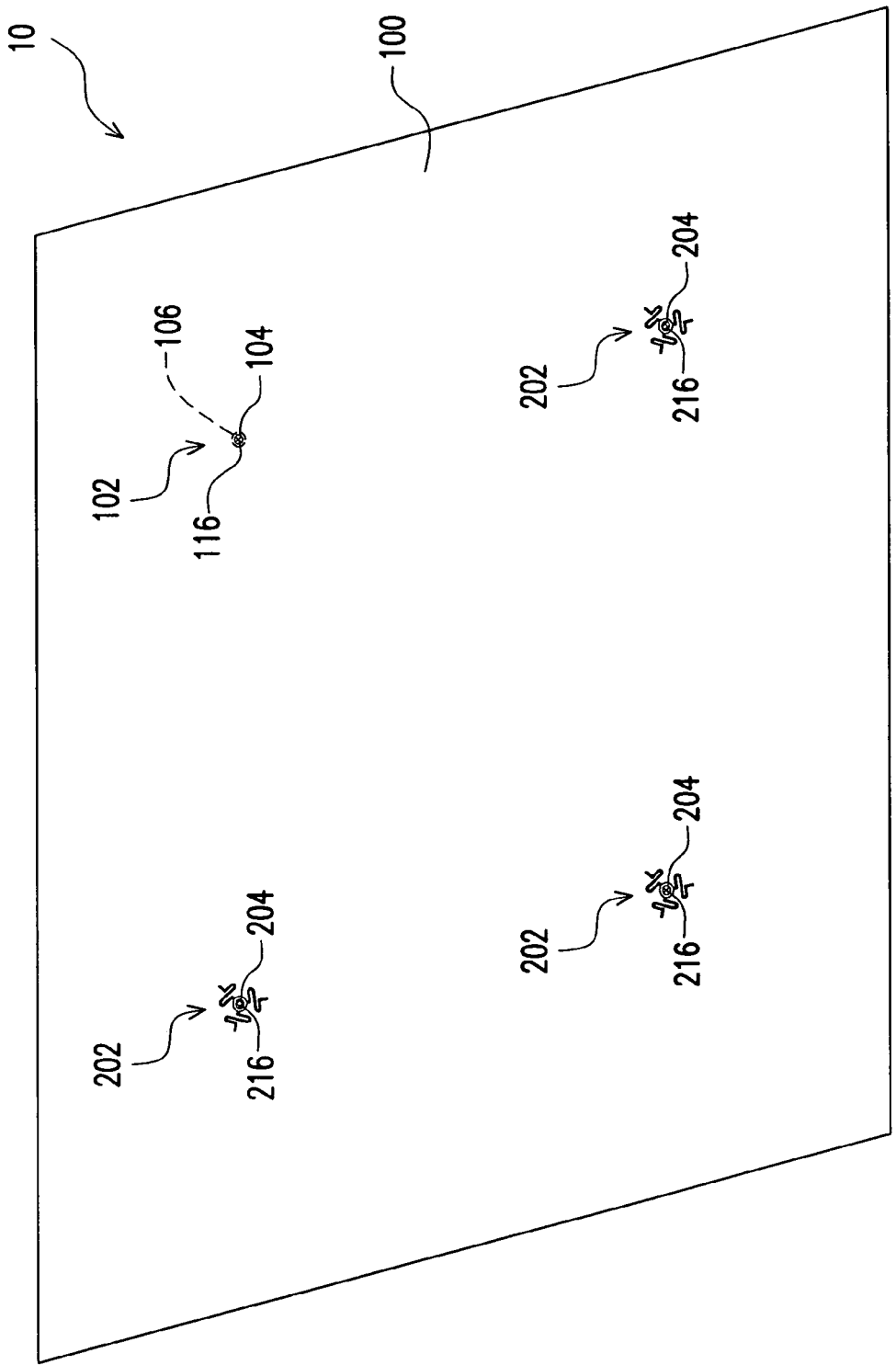
FIG. 1A is a top view of a clamping device for a flexible substrate according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a top view of a clamping device for a flexible substrate according to one embodiment of the present invention. As shown in FIG. 1A, the clamping device 10 for a flexible substrate in the present invention includes a carrier board 100. The carrier board 100 has a fixed positioning assembly 102 and a plurality of movable positioning assemblies 202. The fixed positioning assembly 102 and the movable positioning assemblies 202 are disposed in locations that correspond to a plurality of through holes in the flexible substrate. When the clamping device 10 is used to grip the flexible substrate, the fixed positioning assembly 102 serves as a positioning point. Meanwhile, the movable positioning assemblies 202 has some elasticity for micro-adjusting the orientation so that the flexible substrate can be flattened out smoothly. The carrier board 100 can be fabricated using a metal, a metallic alloy or stainless steel, or ceramics, glass, polymer or composite material, for example. The metal, the metallic alloy or the stainless steel is preferably surface-treated. In other words, polish hardening treatment, etching resistant treatment or insulating film covering operations are performed on the surface of the metal, metallic alloy or the stainless used for forming the steel carrier board 100. The metal may include titanium and aluminum and the metallic alloy may include titanium or aluminum, for example. The polymer is polyimide (PI), poly-tetrafluorine ethylene (PTFE) or polyetheretherketone (PEEK), for example.

Figure 2A:
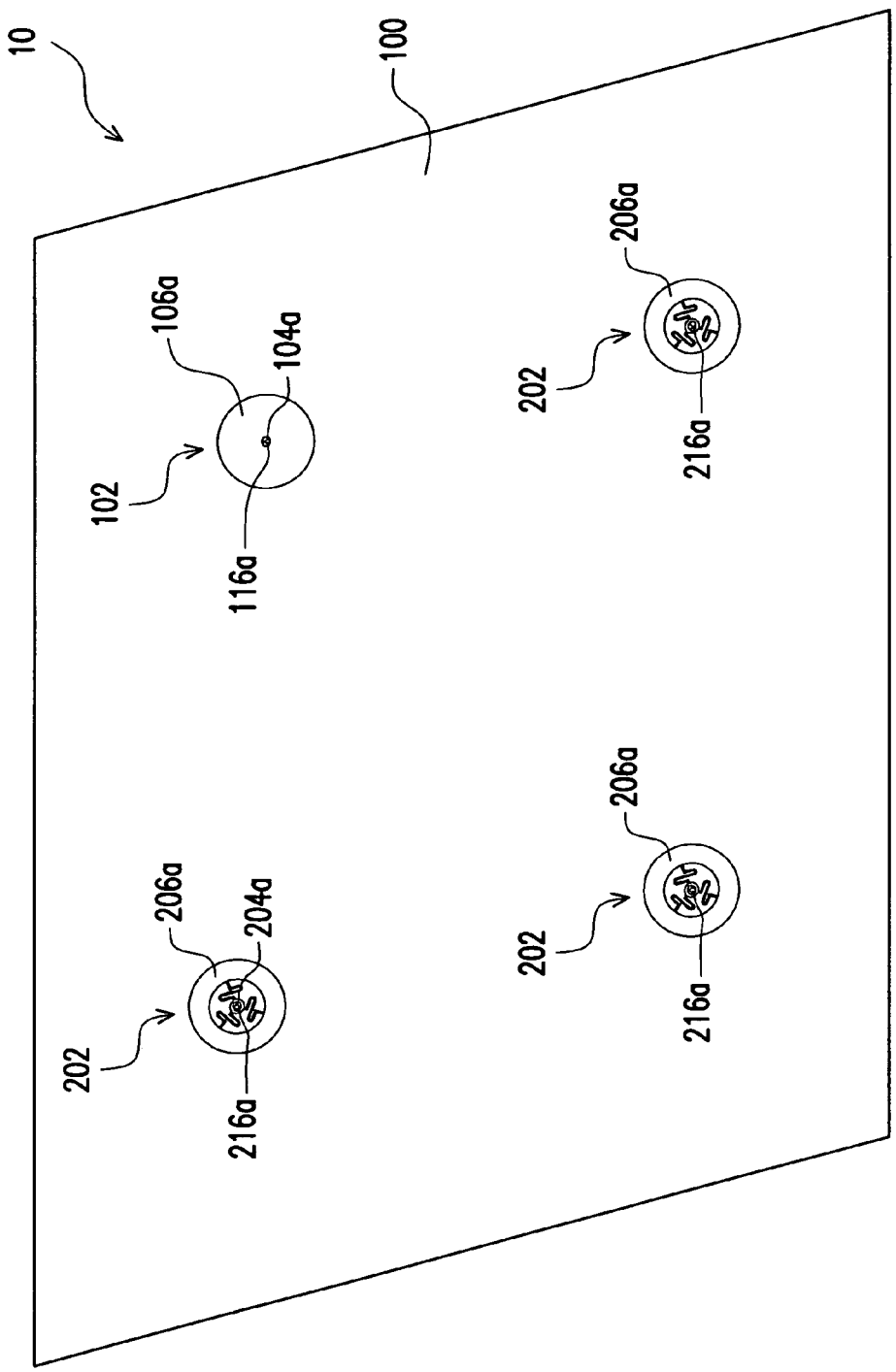
FIG. 2A is a top view of a clamping device for a flexible substrate according to another embodiment of the present invention.

The fixed positioning assembly 102 and the movable positioning assemblies 202 can be integrarlly fabricated with the carrier board 100 thereafter as shown in FIG. 1A. Alternatively, they may be separately fabricated and then flushed into the carrier board 100 thereafter as shown in FIG. 2A.

Figure 1B:
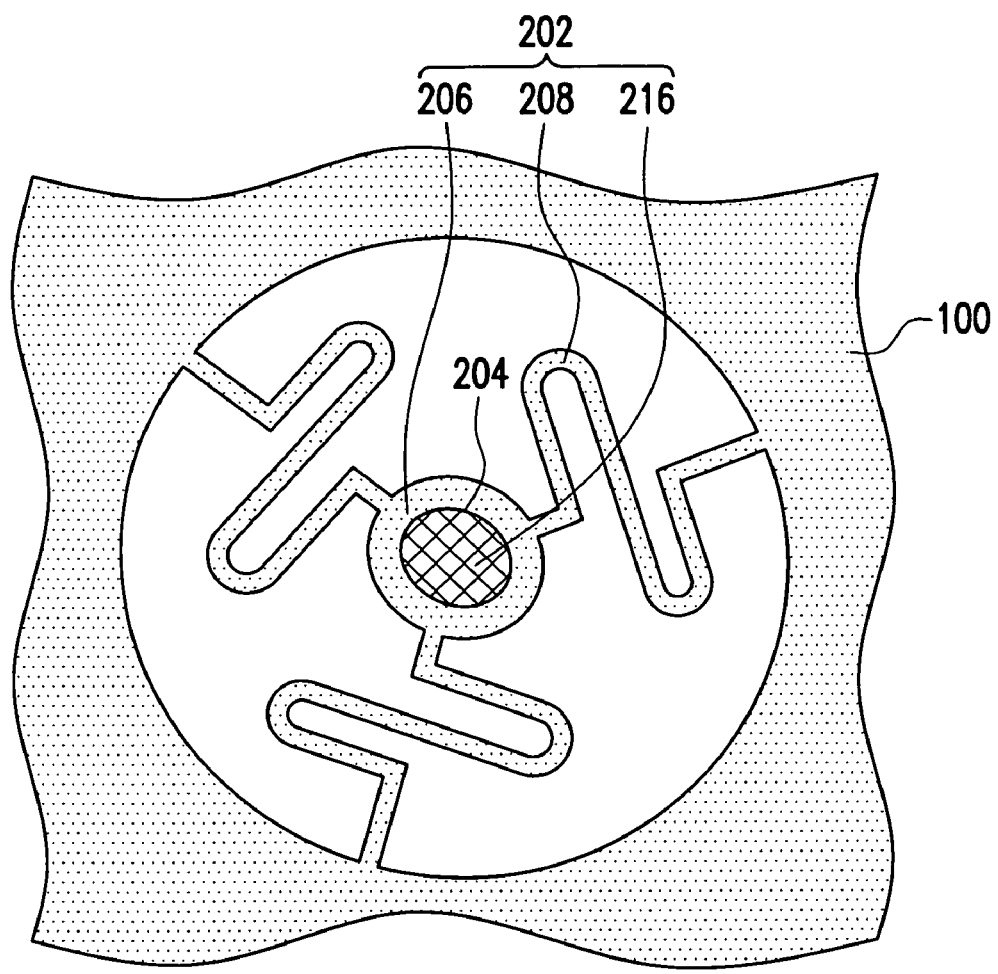
FIG. 1B is a partially magnified view of a movable positioning assembly of the flexible substrate clamping device shown in FIG. 1A.

As shown in FIG. 1A, when the fixed positioning assembly 102 and the movable positioning assemblies 202 are fabricated integrarlly with the carrier board 100 as an integrative unit, the fixed positioning assembly 102 includes a hole body 106 with a positioning hole 104 and a dowel pin 116 for inserting into the positioning hole 104. The fixed positioning assembly 102 is non-movable and its location is fixed. FIG. 1B is a partially magnified view of a movable positioning assembly of the flexible substrate clamping device shown in FIG. 1A.

As shown in FIG. 1B, the movable positioning assemblies 202 includes a hole body 206 with a positioning hole 204, a plurality of curved extending arms 208 and a dowel pin 216. The positioning hole 204 of the movable positioning assemblies 202 and the positioning hole 104 of the fixed positioning assembly 102 correspond to a plurality of through holes in the flexible substrate. Each curved extending arm 208 of the movable positioning assembly 202 is connected to the hole body 206 and the carrier board 100. The dowel pin 216 is suitable for inserting into the positioning hole 204 of the hole body 206. The curved extending arms 208 of the movable positioning assemblies 202 can provide spring force in different directions. Hence, the curved extending arms 208 can be utilized to perform a micro-adjustment of the location of the positioning holes 204 in the hole bodies 206 so that they align with the through holes in the flexible substrate. In other words, when the flexible substrate is put on the carrier board 100, the through holes in the flexible substrate can be aligned with the positioning holes in the respective hole bodies 206 of the movable positioning assemblies 202. Then, the dowel pins 216 are inserted into the through holes of the flexible substrate and the positioning holes 204 of the hole bodies 206. Thereafter, the dowel pin 116 of the fixed positioning assembly 102 is inserted into another through hole in the flexible substrate. Since the curved extending arms 208 in the movable positioning assemblies 202 can provide a little spring force, the application of a small force can shift the location of the positioning hole 204 of the hole body 206 a little bit. Hence, the insertion of the dowel pin 116 into the hole body 106 of the fixed positioning assembly 102 is facilitated and the flexible substrate is snuggly clamped to the carrier board 100.

Figure 1C:
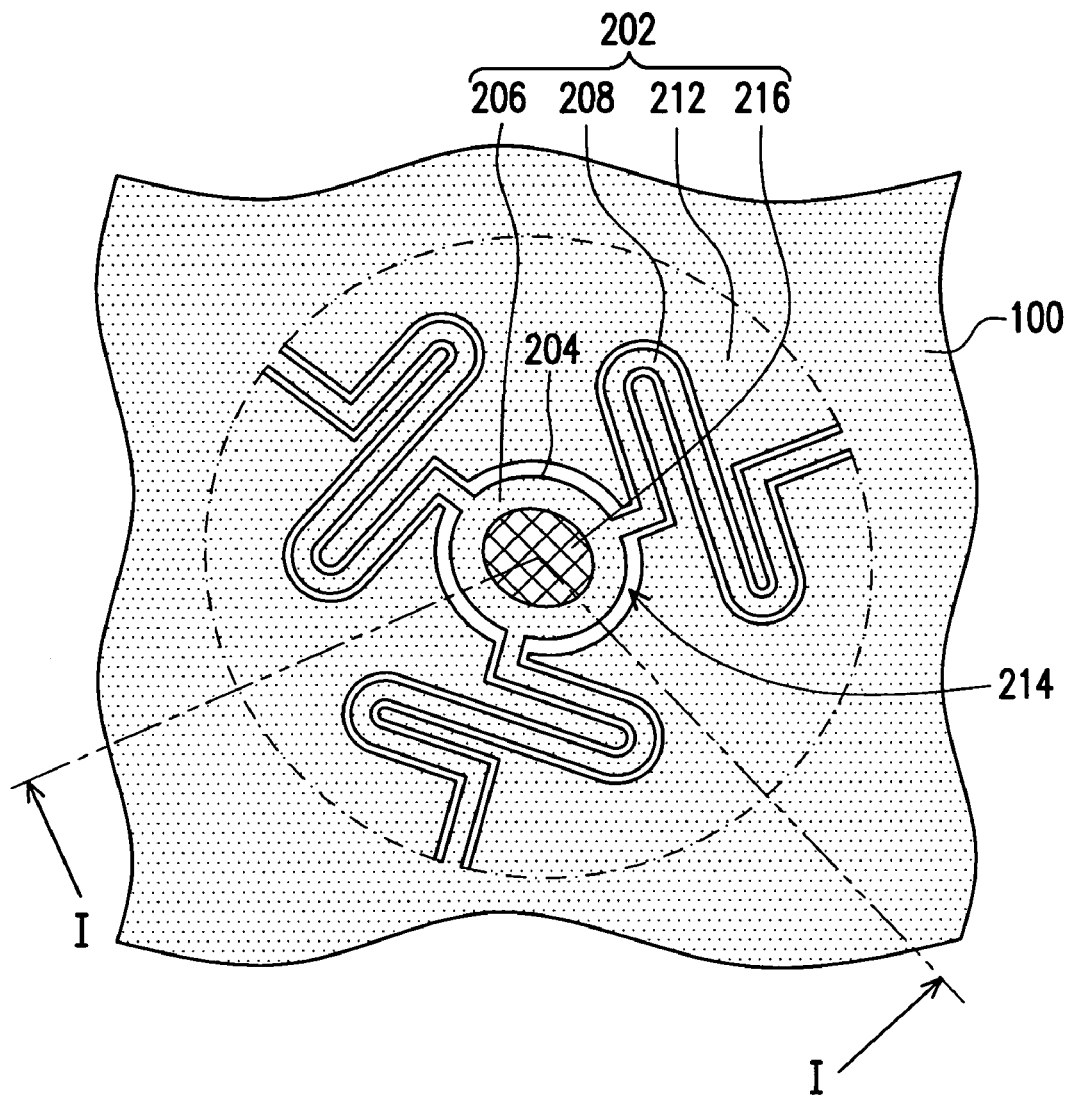
FIG. 1C is a partially magnified view of another movable positioning assembly of the flexible substrate clamping device shown in FIG. 1A.

FIG. 1C is a partially magnified view of another movable positioning assembly of the flexible substrate clamping device shown in FIG. 1A. As shown in FIG. 1C, the movable positioning assemblies 202 further includes at least a shift-limiting portion 212 disposed between two adjacent extending arms 208 and connected to the carrier board 100. Furthermore, there is a gap 214 between the shift-limiting portion 212 and two adjacent extending arms 208 and between the shift-limiting portion 212 and the hole body 206. The width of the gaps 214 can be used to set a limit on the range of movement of the hole body 206.

Figure 1D:
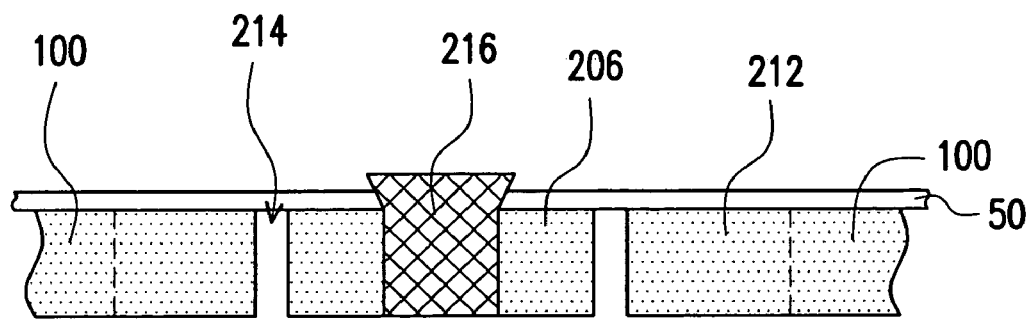
FIG. 1D is a schematic cross-sectional view of another flexible substrate clamping device in FIG. 1A.

FIG. 1D is a schematic cross-sectional view of another flexible substrate clamping device along the line I-I in FIG. 1C. As shown in FIG. 1D, the upper edge of the dowel pins 116 and 216 of the fixed positioning assembly 102 and the movable positioning assembly 202 are fabricated to produce an inverted frustum of a cone that facilitates the clamping of the flexible substrate 50.

Figure 3A:
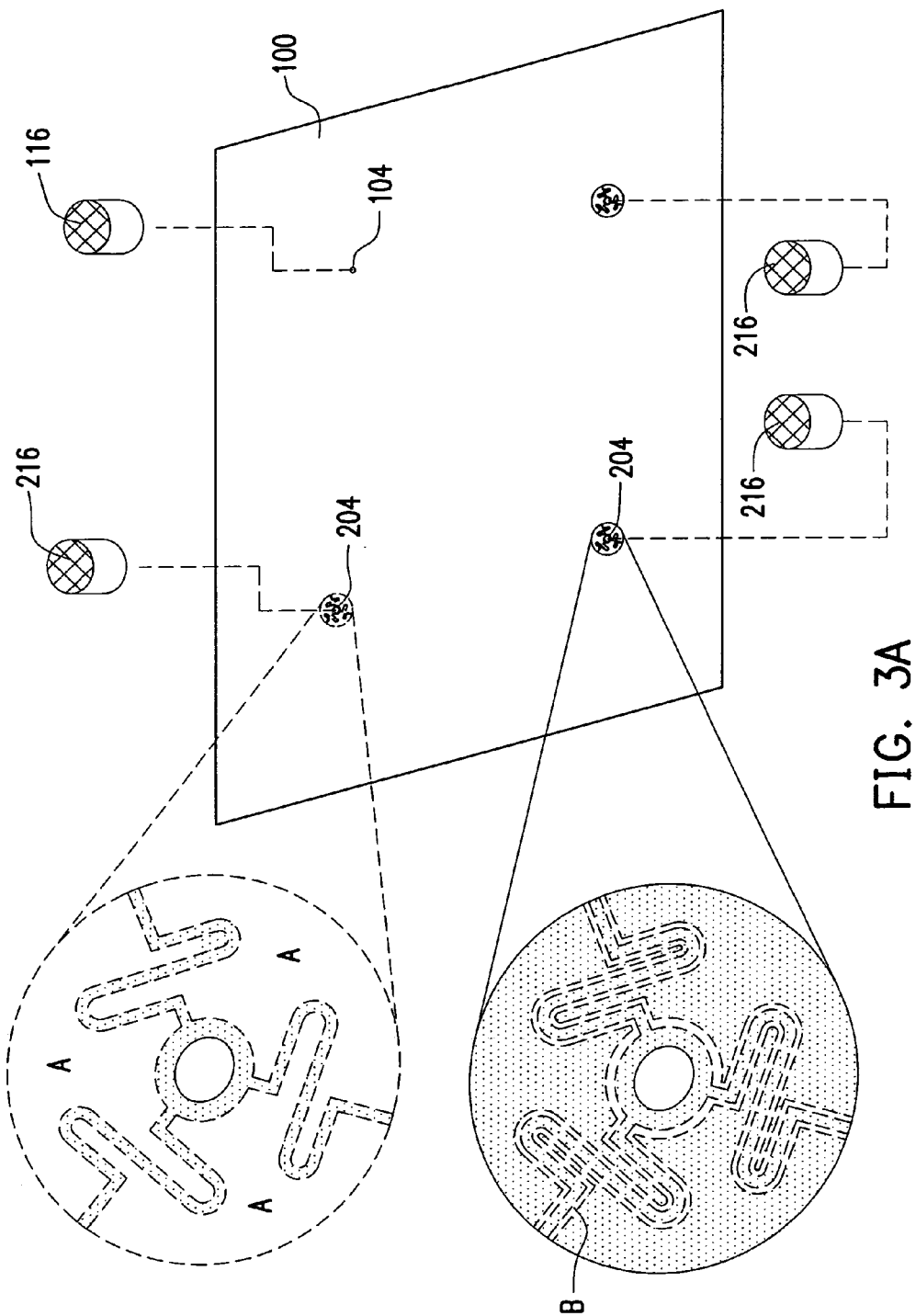
FIG. 3A through 3BB are schematic cross-sectional views showing the steps for forming a flexible substrate clamping device according to one embodiment of the present invention.
Figure 3B:
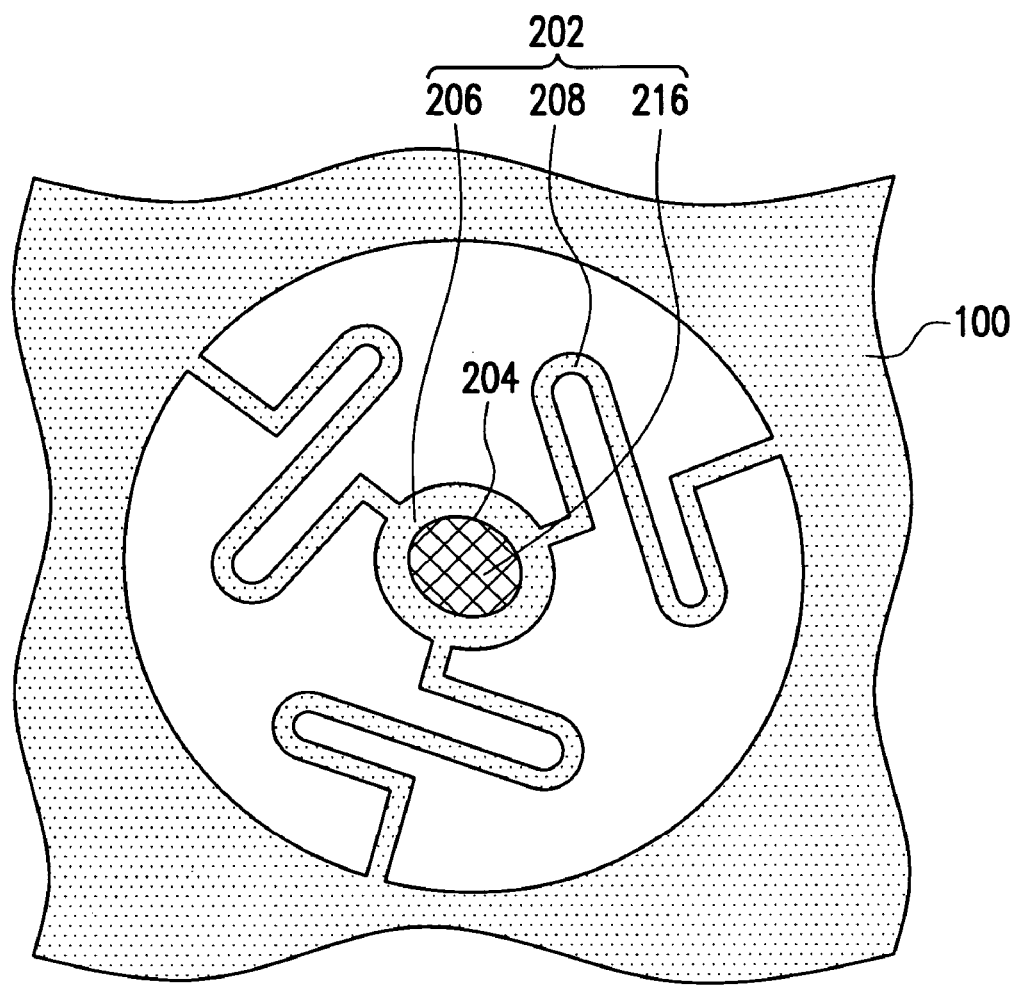
Figure 3B:
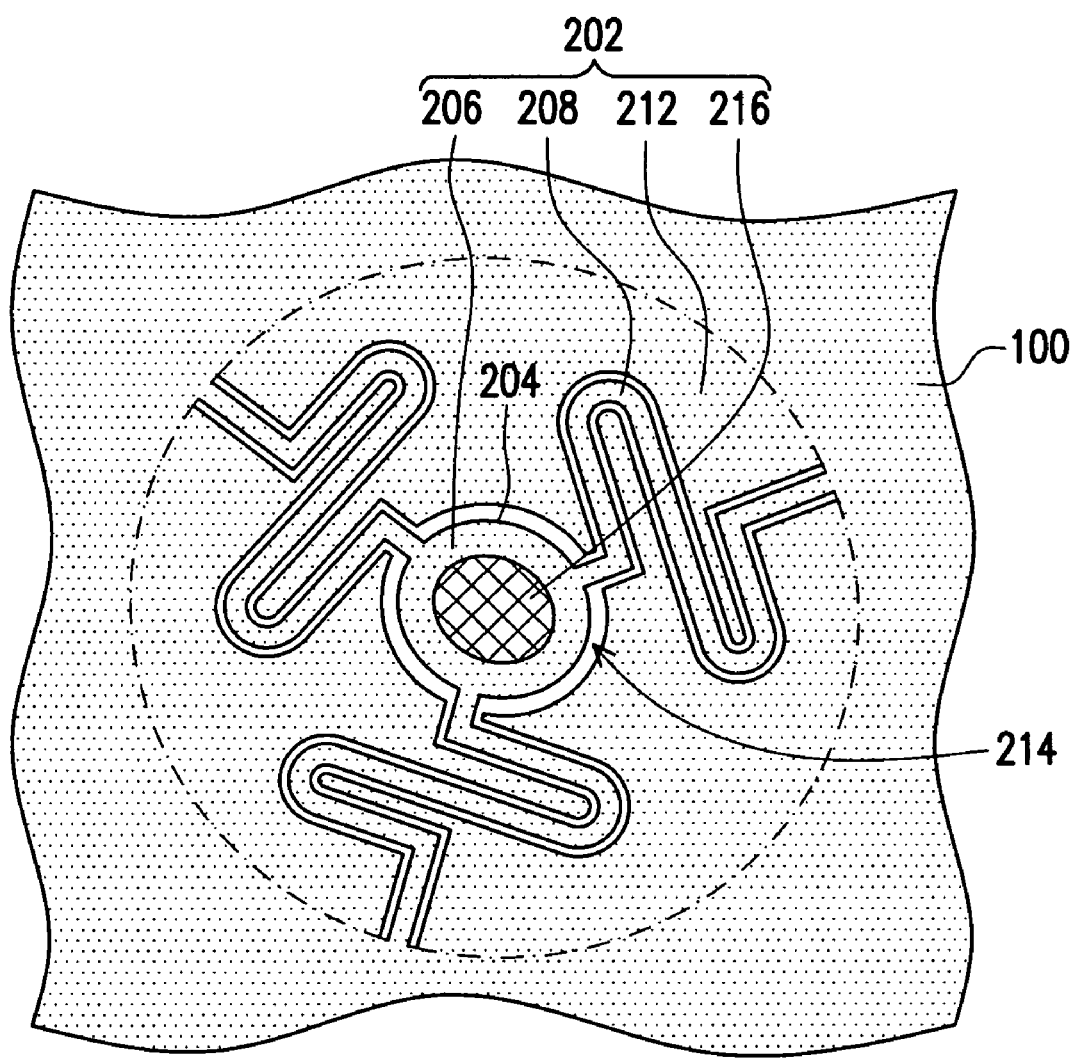

FIGS. 3A through 3BB are schematic cross-sectional views showing the steps for forming a flexible substrate clamping device according to one embodiment of the present invention. The fixed positioning assembly 102 and the movable positioning assemblies 202 as well as the carrier board 100 in the clamping device 10 are integarlly fabricated as an integrative unit. As shown in FIG. 3A, a positioning hole 104 and a plurality of positioning holes 204 are formed in the carrier board 100. The positioning hole 104 and the positioning holes 204 are disposed in locations that correspond with the through holes in the flexible substrate. Furthermore, a dowel pin 116 and dowel pins 216 (magnified) for inserting into the positioning hole 104 and the positioning holes 204 are provided. In one embodiment, the upper edge of the dowel pins 116 and 216 of the fixed positioning assembly 102 and the movable positioning assembly 202 are fabricated to produce an inverted frustum of a cone for improving the clamping. Thereafter, a portion of the carrier board 100 close to the positioning holes 204 is removed as indicated by the area A inside the dashed lines. As a result, the hole body 206 of the movable positioning assemblies 202 and a plurality of curved extending arms 208 that connects with the hole bodies 206 and the carrier board 100 are formed as shown in FIG. 3B. On the other hand, if the material removed from the carrier board 100 is in the area B within the dash line, a hole body 206, a plurality of curved extending arms 208 and a shift-limiting portion 212 are formed as shown in FIG. 3BB. The method of removing a portion of the carrier board 100 close to the positioning holes 204 includes performing a line cutting, a punching or electro-discharge removal process, for example.

FIG. 2A is a top view of a clamping device for a flexible substrate according to another embodiment of the present invention. As shown in FIG. 2A, the fixed positioning assembly 102 and the movable positioning assemblies 202 are independently fabricated and needs to be flushed into the carrier board 100. The fixed positioning assembly 102 includes a hole body 106a with a positioning hole 104a and a dowel pin 116a for inserting into the positioning hole 104a and the fixed positioning assembly 102 is fixed and cannot be moved.

Figure 2B:
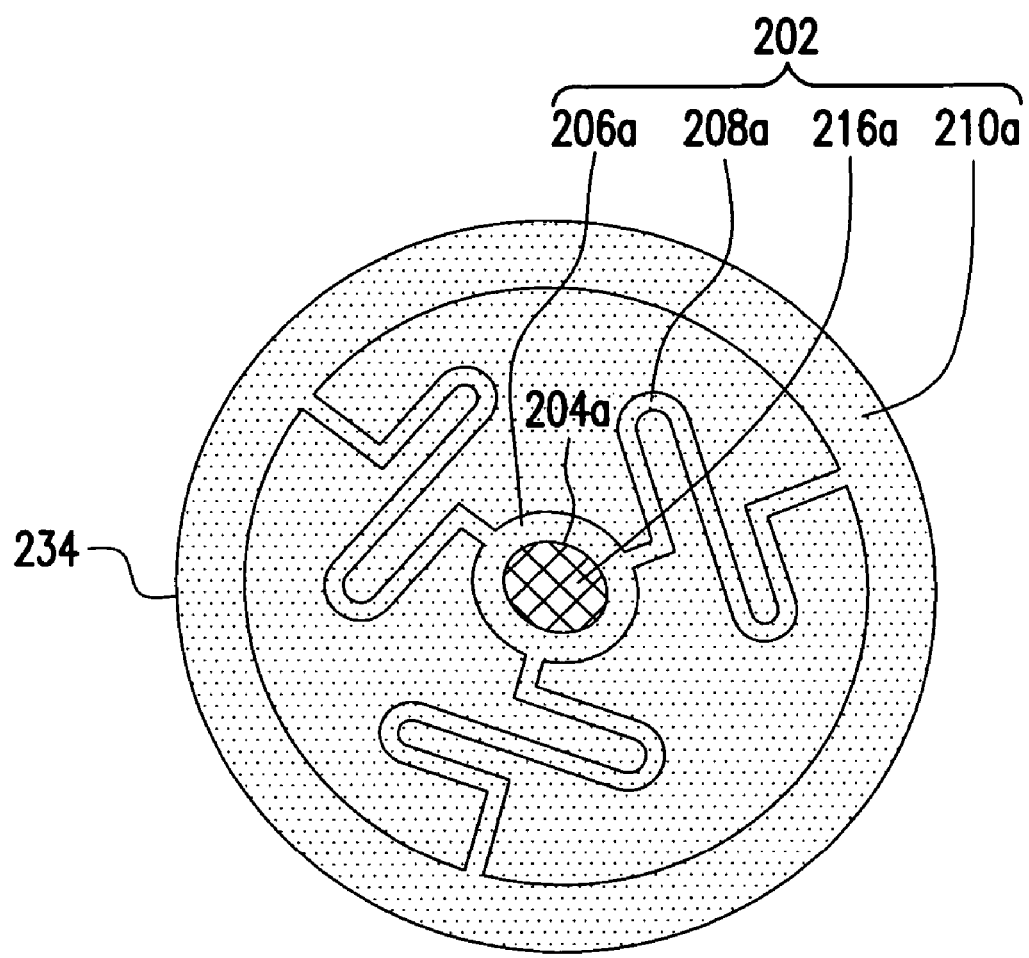
FIG. 2B is a partially magnified view of a movable positioning assembly of the flexible substrate clamping device shown in FIG. 2A.

FIG. 2B is a partially magnified view of a movable positioning assembly of the flexible substrate clamping device shown in FIG. 2A. As shown in FIG. 2B, the movable positioning assembly 202 includes a hole body 206a with a positioning hole 204a, an outer ring 210a, a plurality of curved extending arm2 208a and a dowel pin 216a. The locations of the positioning hole 104a in the fixed positioning assembly 102 and the positioning holes 204a in the movable positioning assemblies correspond to the plurality of through holes in the flexible substrate. The outer ring 210a of the movable positioning assemblies 202 are located outside the hole bodies 206a and are movably connected to the carrier board 100a. Each curved extending arm 208a is connected to the hole body 206a and the outer ring 210. The dowel pin 216a is suitable for inserting into the positioning holes 204a of the hole bodies 206a. The curved extending arms 208a in each movable positioning arms 208a can provide a multi-direction spring force so that the location of the positioning holes 204a of the hole bodies 206a can be micro-adjusted to align with the locations of the through holes in the flexible substrate. In other words, when the flexible substrate is placed on the carrier board 100, the through holes in the flexible substrate may align with the positioning holes 204a of the hole bodies 206a in the movable positioning assemblies 202 first. Then, the dowel pines 216 are inserted into the through holes of the flexible substrate and the positioning holes 204a of the hole bodies 206a. Since the curved extending arms 208 in the movable positioning assemblies 202 can provide a little spring force, the application of a small force can shift the location of the positioning hole 204a of the hole body 206a. Hence, the insertion of the dowel pin 116a into the positioning hole 104a of hole body 106 in the fixed positioning assembly 102 is facilitated and the flexible substrate is clamped snuggly to the carrier board 100.

Figure 2C:
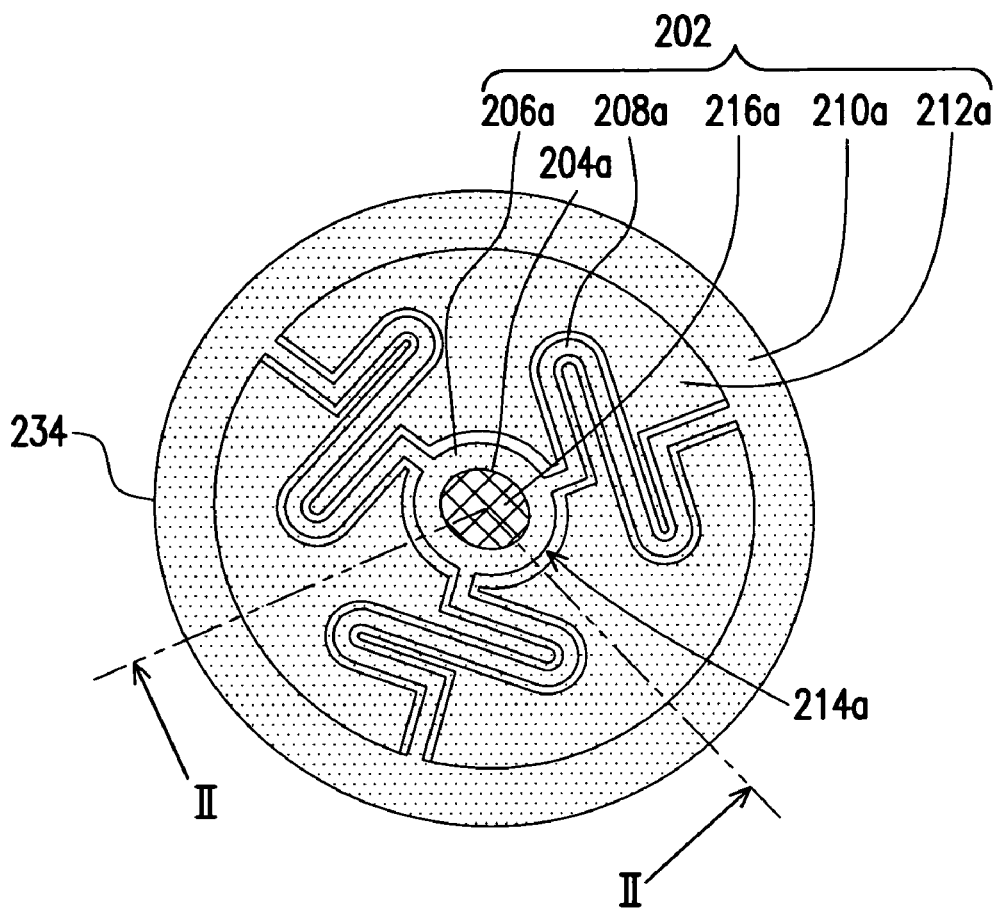
FIG. 2C is a partially magnified view of another movable positioning assembly of the flexible substrate clamping device shown in FIG. 2A.

FIG. 2C is a partially magnified view of another movable positioning assembly of the flexible substrate clamping device shown in FIG. 2A. As shown in FIG. 2C, the movable positioning assemblies 202 further includes at least a shift-limiting portion 212a disposed between two adjacent extending arms 208a and connected to the outer ring 210. Furthermore, there is a gap 214a between the shift-limiting portion 212a and two adjacent extending arms 208a and between the shift-limiting portion 212a and the hole body 206a. The width of the gaps 214a can be used to set a limit on the range of movement of the hole body 206a.

Figure 2D:
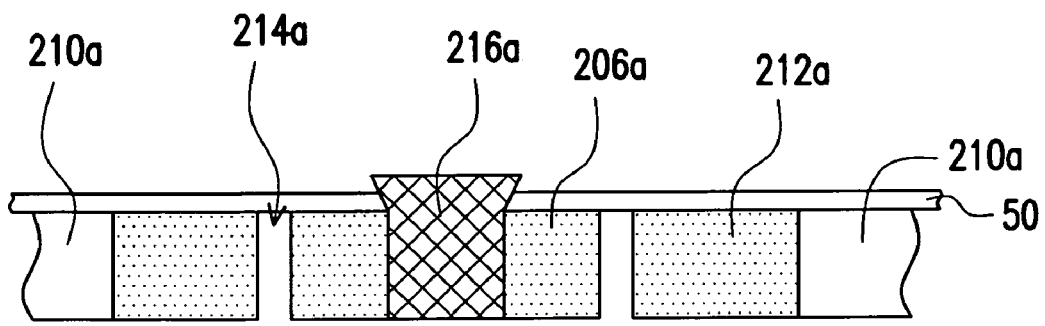
FIG. 2D is a schematic cross-sectional view of another flexible substrate clamping device in FIG. 2A.

FIG. 2D is a schematic cross-sectional view of another flexible substrate clamping device along the line II-II in FIG.

2C. As shown in FIG. 2D, the upper edge of the hole bodies 106a and 206a of the fixed positioning assembly 102 and the movable positioning assembly 202 are fabricated to produce an inverted frustum of a cone that assists the clamping of the flexible substrate 50.

Figure 4A:
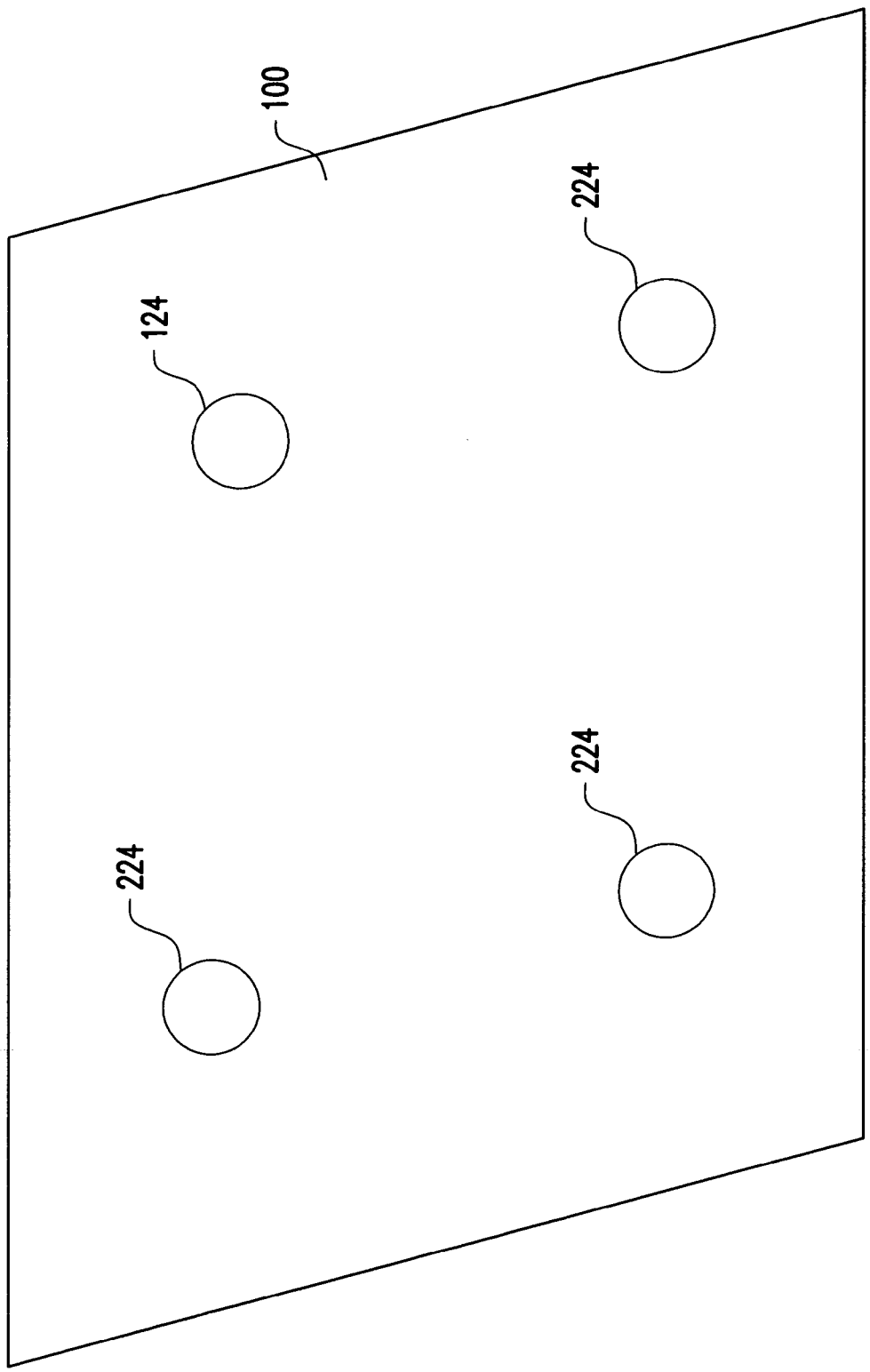
FIG. 4A through 4CC are schematic cross-sectional views showing the steps for forming a flexible substrate clamping device according to one embodiment of the present invention.
Figure 4B:
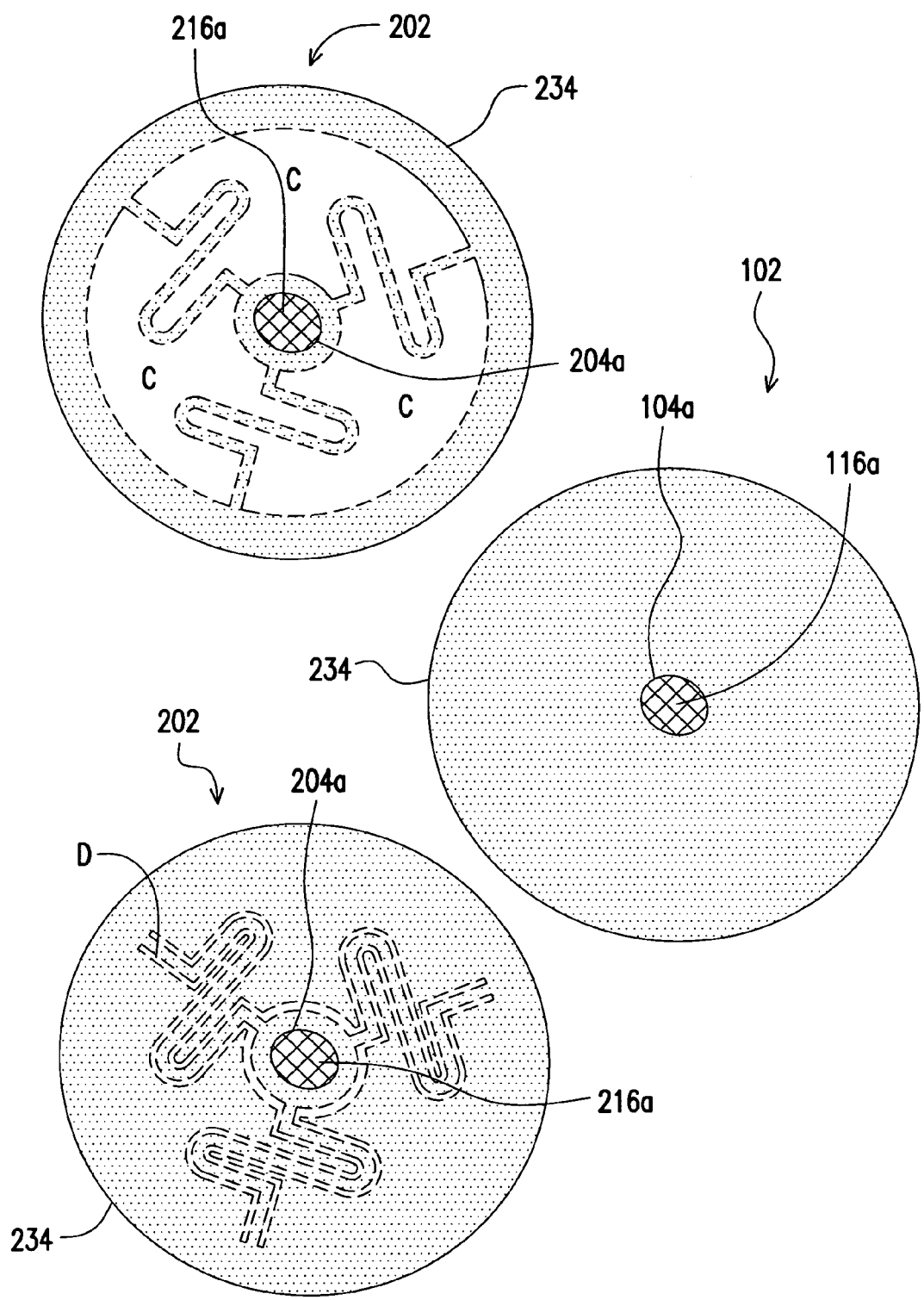
Figure 4C:
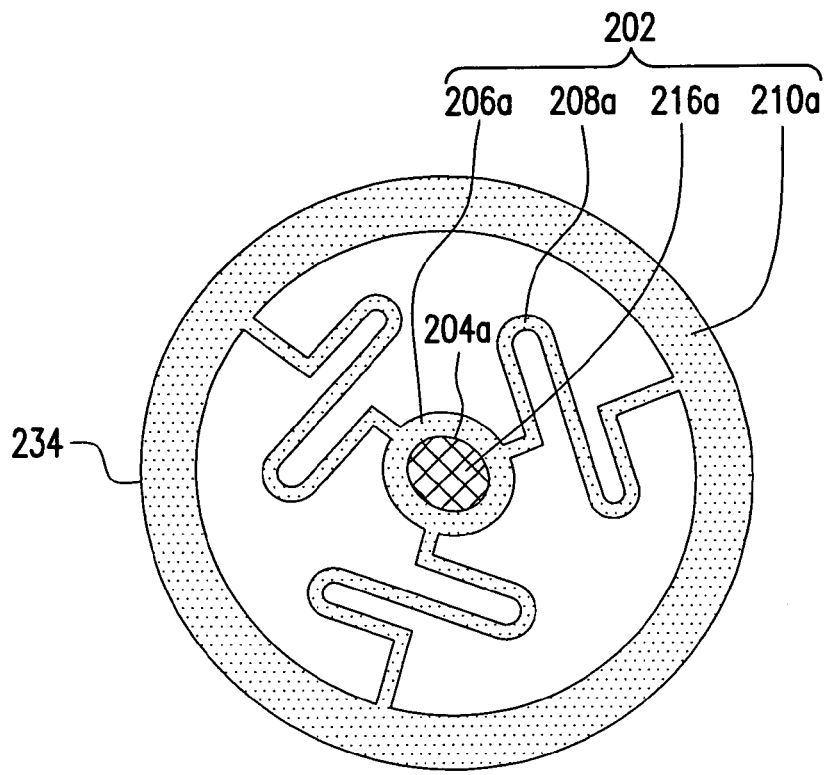
Figure 4C:
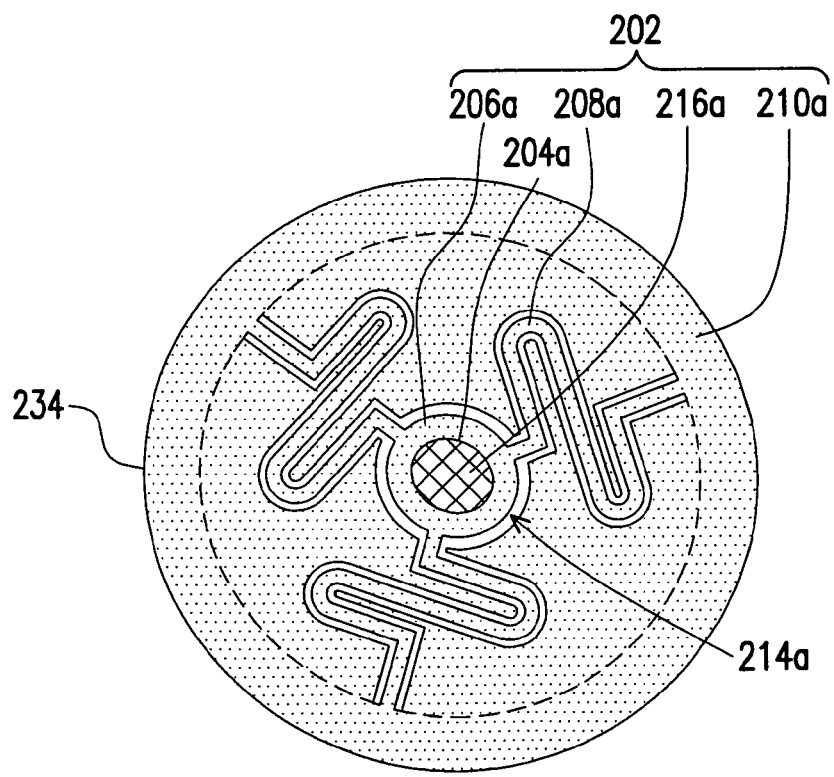

FIGS. 4A through 4CC are schematic cross-sectional views showing the steps for forming a flexible substrate clamping device 10 by flushing in a fixed positioning assembly 102 and movable positioning assemblies 202 to a carrier board 100 according to the present invention. First, as shown in FIG. 4A, a hole 124 and holes 224 are formed in the carrier board 100. Then, as shown in FIG. 4B, a plurality of substrates 234 each having a size matching that of the holes 124 and 224 is provided. Positioning holes 104a and 204a are formed in the substrates 234. The substrates 234 are fabricated using surface-treated metal, metallic alloy or stainless steel, or ceramics, glass, polymer or composite material, for example. Thereafter, dowel pins 116a and 216a for inserting into the positioning holes 104a and 204a are provided. In one embodiment, the upper edge of the dowel pins 116a and 216a of the fixed positioning assembly 102 and the movable positioning assemblies 202 are fabricated to produce an inverted frustum of a cone so that the clamping of the flexible substrate is improved.

Thereafter, a portion of the substrate 234 close to the positioning holes 204a is removed as shown by the area C within the dash lines. As a result, a hole body 206a, an outer ring 210a and a plurality of curved extending arms 208a of the movable positioning assemblies 202 are formed as shown in FIG. 4C. On the other hand, if the material removed from the substrate 234 is in the area D within the dash line, a hole body 206a, an outer ring 210a, a plurality of curved extending arms 208a and a shift-limiting portion 212a are formed as shown in FIG. 4CC. The method of removing a portion of the substrate 234 close to the positioning holes 204a includes performing a line cutting, a punching or electro-discharge removal process, for example.

The strengths and weaknesses between using the flexible substrate clamping device in the present invention and the conventional glue bonding process for attaching the flexible substrate are compared in Table 1.

TABLE 1

| Items | Mechanism | Temp. resistance | Chemical resistant | Weight | planarity | Equipment compatibility |
|---|---|---|---|---|---|---|
| Present Invention | Mechanical | ○ | ○ | Δ | ○ | ○ |
| Bonding through an Adhesive agent | Gluing | x | x | ○ | x | ○ |

Legends:
○: good;
Δ: satisfactory;
x: poor

As shown in Table 1, the clamping device in the present invention is slightly heavier than the conventional method but has a far better chemical resistant and temperature resistance than the conventional gluing method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clamping device for a flexible substrate, comprising: a carrier board having a fixed positioning assembly and a plurality of movable positioning assemblies that are integral to the carrier board, wherein the movable positioning assemblies are capable of repositioning along a planar direction of the carrier board such that the fixed positioning assembly and the movable positioning assemblies correspond roughly in location to a plurality of through holes on the flexible substrate, and each of the plurality of the movable positioning assemblies comprises
   a hole body with a positioning hole;
   a plurality of curved extending arms connected to the hold body and the carrier board; and
   a dowel pin suitable for inserting into the positioning hole.

2. The clamping device of claim 1, wherein the material constituting the movable positioning assemblies includes surface-treated metal, metal alloy or stainless steel, or ceramics, glass, polymer or composite material.

3. The clamping device of claim 1, wherein the movable positioning assembly further includes at least a shift-limiting portion disposed between two adjacent extending arms and connected to the carrier board, and a gap between the shift-limiting portion and two adjacent extending arms and between the shift-limiting portion and the hole body.

4. The clamping device of claim 3, wherein an upper edge of the dowel pin has a shape of an inverted frustum of a cone.

5. The clamping device of claim 1, wherein each movable positioning assembly can movably flush into the carrier board, and comprise:
   a hole body having a positioning hole;
   an outer ring disposed outside the hole body and movably connected to the carrier board;
   a plurality of curved extending arms connected to the hole body and the outer ring; and
   a dowel pin suitable for inserting into the positioning hole of the hole body.

6. The clamping device of claim 5, wherein the movable positioning assembly further includes at least a shift-limiting portion disposed between two adjacent extending arms and connected to the outer ring, and a gap between the shift-limiting portion and the two adjacent extending arms and between the shift-limiting portion and the hole body.

7. The clamping device of claim 5, wherein the upper edge of the dowel pin has the shape of an inverted frustum of a cone.

8. The clamping device of claim 1, wherein the material constituting the carrier board includes surface-treated metal, metal alloy or stainless steel, or ceramics, glass, polymer or composite material.

* * * * *